United States Patent [19]
Koshiishi et al.

[11] Patent Number: 6,072,147
[45] Date of Patent: Jun. 6, 2000

[54] PLASMA PROCESSING SYSTEM

[75] Inventors: Akira Koshiishi, Kofu; Jun Ooyabu, Ryuo-cho, both of Japan

[73] Assignee: Tokyo Electron Limited, Japan

[21] Appl. No.: 08/982,388

[22] Filed: Dec. 2, 1997

[30] Foreign Application Priority Data

Dec. 5, 1996 [JP] Japan .................................. 8-340614

[51] Int. Cl.$^7$ .................................................. B23H 1/00
[52] U.S. Cl. ....................................... 219/121.43; 216/68
[58] Field of Search .................... 219/131.43; 156/345; 204/298.38; 216/68, 60, 67; 118/723, 723 IR; 315/111.51

[56] References Cited

U.S. PATENT DOCUMENTS

| | | | |
|---|---|---|---|
| 4,233,109 | 11/1980 | Nishizawa | 216/67 |
| 4,844,775 | 7/1989 | Keeble | 216/68 |
| 5,565,114 | 10/1996 | Saito et al. | 216/60 |
| 5,763,851 | 6/1998 | Forster et al. | 219/121.43 |
| 5,772,833 | 6/1998 | Inazawa et al. | 156/345 |
| 5,824,158 | 10/1998 | Takeuchi et al. | 118/723 IR |

FOREIGN PATENT DOCUMENTS

| | | |
|---|---|---|
| 742577 | 11/1996 | European Pat. Off. . |
| 61-133630 | 6/1986 | Japan . |
| 4-346428 | 12/1992 | Japan . |
| 9-74089 | 3/1997 | Japan . |

*Primary Examiner*—Teresa Walberg
*Assistant Examiner*—Quang Van
*Attorney, Agent, or Firm*—Smith, Gambrell & Russell, LLP

[57] ABSTRACT

A plasma processing system capable of carrying out a uniform processing is provided.

According to the present invention, a substantially annular high-frequency antenna 156 of a predetermined number of turns, e.g., 1 turn, is provided in an opening 102b via a first shielding member 160 and a dielectric member 158. The capacitance of a variable capacitor 172 connected to ground is adjusted so that series resonance occurs at the mid point of the high-frequency antenna 156. With this construction, it is possible to form a desired electric field in a plasma producing space to produce a high-density plasma. In addition, a feeding member 126 is formed so that the substantially vertical cross-section thereof has a profile expressed by an exponential function $r=f(L)$. Therefore, it is possible to supply a high-frequency power to an upper electrode without causing the electric breakdown and the damping of the high-frequency power.

5 Claims, 5 Drawing Sheets

PLASMA PROCESSING SYSTEM

BACKGROUND OF THE INVENTION

The present invention relates generally to a plasma processing system.

Conventionally, in order to carry out a plasma processing, e.g., etching process, of an object to be processed, e.g., a semiconductor wafer (which will be hereinafter referred to as a "wafer"), is used a capacitive coupled etching system, i.e., a parallel plate etching system, wherein a substantially cylindrical susceptor serving as a lower electrode is provided at a lower portion of a processing chamber formed in a substantially cylindrical sealed processing container and wherein a substantially disk-shaped upper electrode is provided at a location facing the susceptor.

In such a capacitive coupled etching system, a wafer is first mounted on the susceptor, and then, a processing gas is introduced into the processing chamber maintained at reduced pressure. Thereafter, when a high-frequency power for producing plasma is applied to the upper electrode via a feeding rod, the processing gas introduced into the processing chamber dissociates to excited plasma. Then, ions in the plasma are effectively drawn into a surface to be processed, by a high-frequency bias power applied to the susceptor, so that a desired etching process is carried out.

An inductively coupled etching system is also used, which can carry out a process at a higher etching rate than that of the capacitive coupled etching system by enhancing the density of plasma in the processing chamber. In such an etching system, a substantially cylindrical susceptor serving as a lower electrode is arranged at a lower portion in a substantially cylindrical sealed processing container, and a substantially annular high-frequency coil is arranged on the outer periphery of the processing container via a dielectric wall.

When an etching process is carried out using the inductively coupled etching system, a wafer is first mounted on the susceptor, and then, a processing gas is introduced into a processing chamber maintained at reduced pressure. Thereafter, when a high-frequency power is applied to the high-frequency coil, an electric field is produced in the processing chamber via the dielectric wall. This electric field causes the processing gas in the processing chamber to dissociate to excited plasma. Then, ions in the plasma are effectively drawn into a surface of the wafer to be processed, by a high-frequency bias power applied to the susceptor, so that a desired etching process is carried out.

Recently, with the super high integration and miniaturization of semiconductor devices, more hyperfine patterning technology has been required. Also in etching processes, it has been required to further improve an etch selectivity and to develop a system which can process a larger wafer at a high etching rate, in order to improve the productivity.

Thus, in order to carry out the etching process of a wafer at a high etch selectivity and at a high etching rate, it has been attempted to enhance the density of plasma in a processing chamber and to change the position at which a processing gas is introduced.

However, in order to enhance the density of plasma in the capacitive coupled etching system, a high-output high-frequency power must be applied to the upper electrode, and a self-bias voltage produced by the high-frequency power is also increased with the output ascension of the high-frequency power. Consequently, during an etching process, the upper electrode is sputtered by the ions in the plasma so as to be significantly consumed, so that there is a problem in that the lowering of throughput may result from the required exchange of the upper electrode.

In addition, near the connecting portion of the feeding rod and the upper electrode in the capacitive coupled etching system, impedance is suddenly changed due to the difference between the lateral cross-sections thereof. Therefore, with the output ascension of the high-frequency power applied to the upper electrode, there are problems in that electric current may flow through the surface of an insulating material, which is provided so as to surround the upper electrode, to cause a dielectric electric breakdown or power damping, so that heat may be produced to damage the insulating material.

Moreover, the inductively coupled etching system can generate a high-density plasma in the processing chamber by increasing the output of a high-frequency power applied to a high-frequency antenna. However, there is a problem in that the inner wall surface of the processing container may be sputtered so as to be damaged. In addition, when the pressure in the processing chamber is relatively high, e.g. 20 mTorr or more, plasma may be biased so as to exist in the peripheral portion of the processing container, so that the density of plasma may be uneven so as to lower the stability and repeatability of the etching process.

In addition, in the inductively coupled etching system, a coil is wound onto the outer periphery of the processing container a plurality of times, so that the size of the processing container is increased. Also, when the size of the processing container is further increased as the diameter of the wafer is increased, it is difficult to obtain a desired reduced-pressure atmosphere. Consequently, the residence time of the gas in the processing chamber is increased, so that a reaction gas dissociates excessively to decrease the etch selectivity and to decrease the exhaust efficiency of a reaction product. Therefore, there is a problem in that the reaction product may be not only adhered to an object to be processed, to decrease the yield, but it may also be adhered to the inner surface of the processing container and the upper electrode.

SUMMARY OF THE INVENTION

It is therefore an object of the present invention to eliminate the aforementioned problems in conventional plasma processing systems and to provide a novel, improved plasma processing system, which can carry out a uniform plasma processing at a high etch selectivity and at a high etching rate even if the diameter of the system is increased, by providing an inductively coupled antenna having a predetermined number of turns (e.g., the number of turns is 1) outside a processing container of a capacitive coupled plasma processing system (e.g., a parallel plate etching system) and changing the shape of an upper electrode thereof.

The present invention is applied to a plasma processing system, wherein an upper electrode and a lower electrode capable of mounting thereon an object to be processed, are arranged so as to face each other in a sealed processing chamber and wherein plasma produced between the upper and lower electrodes by applying a predetermined high-frequency power to the upper and lower electrodes is drawn into the object mounted on the lower electrode to carry out plasma processing.

In order to accomplish the aforementioned and other objects, according to the present invention, an inductively coupled antenna of a predetermined number of turns (e.g. 1 turn) capable of applying a predetermined high-frequency power is arranged so as to surround a plasma producing space formed between an upper electrode and a lower electrode, and an insulating wall (158a) is arranged between the antenna and the plasma producing space, the antenna being shielded on the sides other than the side of the plasma producing space.

The number of turns of the inductively coupled antenna may be set so as to surround the plasma producing space formed between the upper and lower electrodes. The number of turns of the inductively coupled antenna is preferably set to be as small as possible, e.g., 1 turn, so as to prevent the distance between the upper and lower electrodes from increasing.

According to the present invention, since the inductively coupled antenna of the predetermined number of turns is so arranged, it is possible to produce plasma in the plasma producing space even through the inductively coupled antenna. Consequently, it is possible to suppress the magnitude of the high-frequency power applied to the upper electrode in the capacitive coupled plasma processing system, without obstruction. That is, if the magnitude of the high-frequency power applied to the upper electrode is suppressed in the capacitive coupled plasma processing system, there is a possibility that the density of plasma decreases in an end region of the plasma producing space between the upper and lower electrodes. However, since it is possible to produce plasma in the end region of the plasma producing space by means of the inductively coupled antenna, it is possible to generate uniformly a high-density plasma over the whole plasma producing space, so that it is possible to suppress the magnitude of the high-frequency power applied to the upper electrode. Since it is possible to suppress the magnitude of the high-frequency power applied to the upper electrode in the capacitive coupled plasma processing system, it is possible to eliminate the following problems: that the self-bias produced by the high-frequency power is suppressed, that the upper electrode is sputtered by ions in plasma during the etching process to be significantly consumed, and that the throughput is lowered by the need of exchange of the upper electrode.

In addition, since the high-frequency power is applied to the upper electrode in the capacitive coupled plasma processing system to produce plasma in the plasma producing space between the upper and lower electrodes, it is not required to apply an excess of high-frequency power to the inductively coupled antenna of the predetermined number of turns. Consequently, it is possible to eliminate the aforementioned problem caused by increasing the output of the high-frequency power applied to the high-frequency antenna, i.e., the problem that the inner wall surface of the processing container is sputtered so as to be damaged.

Since the high-density plasma is produced between the upper and lower electrodes by the function of a predetermined electric field formed in the plasma producing space through the insulating wall from the inductively coupled antenna of the predetermined number of turns, the etching rate is improved.

Since the sides of the antenna other than side of the plasma producing space are grounded to be shielded by a wall portion of the container it is possible to prevent plasma which does not contribute to etching from being produced, and it is not necessary to provide a separate shielding member. When the antenna is wound only by 1 turn, it is possible to obtain a high-density plasma without particularly increasing the distance between the upper and lower electrodes. Therefore, since it is not required to particularly increase the distance between the upper and lower electrodes even if the diameter of the wafer is increased, it is possible to prevent the residence time from increasing due to the decrease of the exhaust capacity. Consequently, since it is possible to improve the etching selectivity and to decrease the amount of the reaction product, the etching characteristic can be improved.

In addition, according to the present invention, the inductively coupled antenna is provided in the wall portion of the processing chamber via the insulating wall, and the antenna is exposed to atmosphere. Therefore, since the antenna is arranged under atmospheric pressure, not reduced pressure, it is possible to prevent unnecessary discharge from being produced between the antenna and the grounded processing container.

Moreover, according to the present invention, a capacitor is provided in a line of the antenna on the side of ground, and the capacitance of the capacitor is adjusted so that series resonance occurs at the mid point of the antenna, i.e., so that the following formula (1) is satisfied.

$$\frac{L\omega}{2} = \frac{1}{C\omega} \tag{1}$$

Therefore, it is possible to form a relatively uniform electric field over a range extending from the feeding side of the antenna to the ground side thereof. Consequently, it is possible to prevent the insulating wall (158a) formed between the antenna and the plasma producing space from being excessively sputtered by ions in plasma, and to prevent reaction products from being adhered thereto.

Further, the plasma processing system of the present invention includes a detector for detecting a self-bias voltage (which will be hereinafter referred to as "Vdc") of the high-frequency power applied to the upper electrode, and control means for controlling so that the Vdc detected by the detector is maintained in a set range. When a high-frequency power for producing plasma is applied to the upper electrode during plasma processing, the upper electrode may be sputtered by ions in plasma so as to be damaged. This sputtering function is influenced by the intensity of the Vdc of the high-frequency power for producing plasma. Therefore, if the Vdc of the high-frequency power applied to the upper electrode is detected and if the output of the high-frequency power applied to the upper electrode is controlled by the control means on the basis of the detected Vdc, it is possible to inhibit the upper electrode from being excessively sputtered.

Furthermore, as described above, the plasma processing system of the present invention is designed to apply a high-frequency power for producing plasma to the upper electrode. If the high-frequency power is applied only to the antenna and if series resonance occurs at the mid point of the antenna, it may be difficult to ignite the plasma. In addition, if the high-frequency power is applied only to the antenna, when the pressure in the processing chamber is high, e.g., 20 mTorr or more, the plasma may be biased so as to exist at the peripheral portion of the processing container. Therefore, according to the present invention, the high-frequency power is applied to the upper electrode to produce plasma, so that the plasma can be easily ignited to be uniformly excited.

In the plasma processing system of the present invention, an exchangeable insulating member (160) for covering the peripheral portion of the upper electrode on the side of the processing chamber, and the surface of the antenna on the side of the processing chamber, is further comprised. During plasma processing, the surfaces contacting the plasma producing space formed in the processing chamber, particularly the surface of the upper electrode on the side of the processing chamber and the surface of the antenna on the side of the processing chamber, are easily sputtered by ions in the plasma. Therefore, with this construction, even if the insulating material is sputtered so as to be damaged, only the insulating material (160) need be exchanged, so that the throughput can be improved.

In the plasma processing system of the present invention, the feeding line for introducing a high-frequency power from the feeding rod into the upper electrode is formed as follows. That is, from a feeding portion having a substantially circular cross-section of a first diameter to a connector portion for applying a high-frequency power to an upper electrode having a substantially circular cross-section of a second diameter, the profile of the substantially vertical cross-section of the feeding line is formed so that the maximum value of variation in impedance per unit length from the feeding portion toward the connector portion is minimum, i.e., so that the following exponential function (2) is satisfied.

$$r = f(L) = R \cdot \exp(-\alpha \cdot L / \beta) \qquad (2)$$

With this construction, it is possible to prevent the dielectric breakdown and the damping of the high-frequency power, and it is possible to prevent the damage and heat production of the insulating member, which covers the feeding line and the upper electrode.

BRIEF DESCRIPTION OF THE DRAWINGS

The present invention will be understood more fully from the detailed description given herebelow and from the accompanying drawings of the preferred embodiment of the invention. However, the drawings are not intended to imply limitation of the invention to a specific embodiment, but are for explanation and understanding only.

In the drawings.

DESCRIPTION OF THE PREFERRED EMBODIMENT

Referring now to the accompanying drawings, the preferred embodiment of a plasma processing system according to the present invention, which is applied to a capacitive coupled etching system, i.e., a parallel plate etching system, will be described below. Furthermore, the same reference numbers are used for elements having substantially the same functions and constructions, and duplicate descriptions are omitted.

Figure 1:
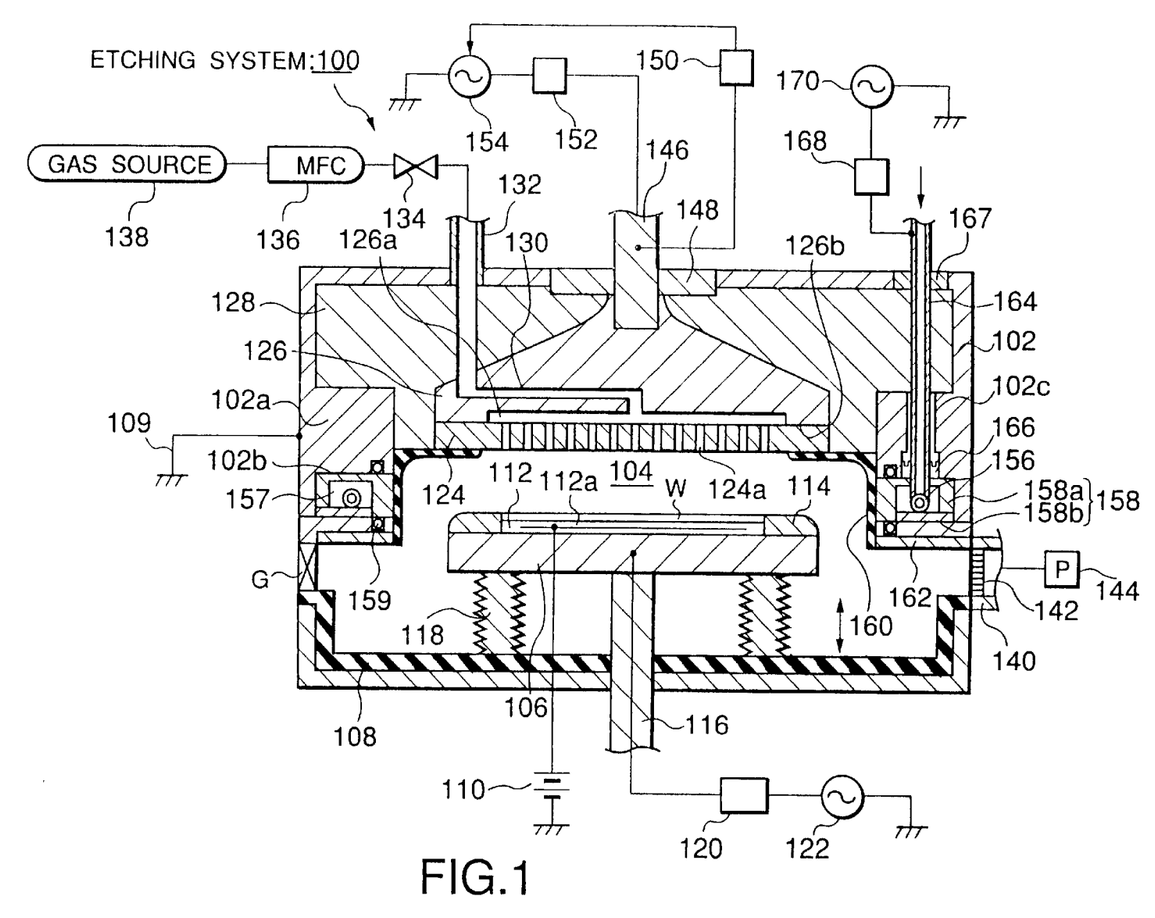
FIG. 1 is a schematic sectional view of the preferred embodiment of an etching system according to the present invention.

As shown in FIG. 1, an etching system 100 has a substantially cylindrical sealed processing container 102 of a conductive material, e.g., aluminum, the surface of which is anodized. The processing container 102 can be open and closed, and defines a processing chamber 104 therein. The processing container 102 is grounded by means of a grounding conductor 109. The lower side walls and bottom portion of the processing container 102 are covered with an insulating member 108 of an insulating material, e.g., a ceramic.

In the processing chamber 104, a substantially cylindrical lower electrode, i.e., a susceptor 106, of aluminum, the surface of which is anodized. The susceptor 106 also serves as a mount plate for mounting thereon a wafer W of, e.g., 12 inches. The susceptor 106 is supported on the bottom face of the processing container 102 by means of an elevator shaft 116, to which an elevator mechanism (not shown) is connected. Between the bottom face of the susceptor 106 and the bottom portion of the processing container 102, an extensible seal member, i.e., a bellows 118, is provided so as to surround the elevator shaft 116.

Thus, the susceptor 106 is movable in vertical directions by means of the elevator shaft 116 by the operation of the elevator mechanism (not shown). For example, when the carrying-in and carrying-out of the wafer W are performed, the susceptor 106 moves downwards to the mounting position of a gate valve G provided between the processing chamber 104 and a load-lock chamber (not shown), and when a processing is carried out, the susceptor 106 moves upwards to a predetermined processing position. Even if the susceptor 106 moves in vertical directions, the airtight of the processing chamber 104 is maintained by means of the bellows 118.

The mounting surface of the susceptor 106, on which the wafer W is mounted, is provided with an electrostatic chuck 112 having the same shape as the wafer W. The electrostatic chuck 112 comprises a conductive layer 112a sandwiched between, e.g., two polyimide films. Thus, after the wafer W is mounted on the susceptor 106, i.e., on the electrostatic chuck 112, when a high-voltage DC power of, e.g., 1.5 kV, is applied to the conductive layer 112a by means of a high-voltage DC power supply 110, the wafer W can be attracted to be maintained at the mounting position by Coulomb force.

Moreover, a substantially annular focus ring 114 of an insulating material, e.g., a ceramic, is provided so as to surround the mounting surface of the susceptor 106, on which the wafer W is mounted, so that etchant ions in plasma produced during an etching process can be effectively incident on the wafer W.

In the susceptor 106, a substantially annular refrigerant circulating passage (not shown) is provided. This refrigerant circulating passage is connected to a temperature control mechanism (not shown). Thus, a refrigerant, e.g., water or ethylene glycol, is circulated between the temperature control mechanism and the refrigerant circulating passage to absorb the heat of the wafer W, which is generated during the etching process, through the susceptor 106, so that the temperature of the wafer W can be maintained at a predetermined temperature, e.g., 25° C.

In the mounting surface of the susceptor 106, on which the wafer W is mounted, i.e., in the electrostatic chuck 112, a plurality of heat-transferring gas supply holes (not shown) are formed substantially concentrically. The respective heat-transferring gas supply holes are connected to a heat-transferring gas supply source (not shown). Thus, a heat-transferring gas, e.g., helium gas, is supplied, via the heat-transferring gas supply holes, from the heat-transferring gas supply source to a fine space formed between the reverse surface of the wafer W and the upper surface of the electrostatic chuck 112, so that the efficiency of heat transfer can be enhanced between the susceptor 106 and the wafer W.

The susceptor 106 is connected to a first high-frequency power supply 122 via a first matching unit 120. Thus, a predetermined high-frequency bias power, e.g., a high-frequency power of 1 to 5 kW, is applied at, e.g., 308 kHz to 2 MHz, preferably 800 kHz, from the first high-frequency power supply 122 to the susceptor 106 via the first matching unit 120, so that the etchant ions can be effectively drawn into the wafer W.

On the upper wall of the processing chamber 104 facing the susceptor 106, there is provided a substantially disk-shaped upper electrode 124 of a conductive material, e.g., aluminum, the surface of which is anodized. On the upper portion of the upper electrode 124, a feeding member 126 of a conductive material, e.g., aluminum, is provided in this preferred embodiment. The detailed descriptions of the shape of the feeding member 126 will be described later.

The diameter of the upper electrode 124 is substantially the same as that of a connector portion 126b being a connecting portion of the feeding member 126 with the upper electrode 124. The upper electrode 124 is mounted on the connector portion 126b so as to come into tight contact therewith. The upper electrode 124 and the feeding member 126 are supported on an upper electrode supporting member 128 of an insulating material, e.g., quartz, provided between the upper electrode 124 and the feeding member 126, and the processing container 102. When the upper electrode 124 is mounted on the connector portion 126b, only the surface of the electrode 124 facing the susceptor 106 is exposed to atmosphere in the processing chamber 104.

The bottom portion of the feeding member 126 is formed with a substantially disk-shaped groove. When the upper electrode 124 is connected to the bottom portion of the feeding member 126, a hollow portion 126a is formed therebetween. The upper electrode 124 is provided with a plurality of gas introducing holes 124a, through which the hollow portion 126a formed between the upper electrode 124 and the feeding member 126 is communicated with the processing chamber 104.

A gas introducing path 130 communicating with the hollow portion 126a is provided in the feeding member 126. The gas introducing path 130 is connected to a gas supply source 138 via a gas introducing pipe 132, a valve 134 and a mass flow controller MFC 136. Thus, a predetermined processing gas supplied from the gas supply source 138 is uniformly introduced into the processing chamber 104 via the mass flow controller MFC 136, the valve 134, the gas introducing pipe 132, the gas introducing path 130, the hollow portion 126a and the gas introducing holes 124.

A lower side wall of the processing container 102 is provided with an exhaust pipe 140. The exhaust pipe 140 is communicated with the processing chamber 104 via an exhaust plate 142, which comprises a panting plate for arranging an exhaust gas flow. The exhaust pipe 140 is connected to an evacuating mechanism P 144 comprising, e.g., a turbo-molecular pump. Thus, when the evacuating mechanism P 144 is operated, the interior of the processing chamber 104 is evacuated via the exhaust pipe 140 and the exhaust plate 142, so as to be maintained at a predetermined reduced pressure, e.g., at a pressure of 1 to 100 mTorr.

A substantially annular feeding-rod supporting member 148 of an insulating material, e.g., a ceramic, is provided on the upper portion of the feeding member 126 substantially. A feeding rod 146 passes through the feeding-rod supporting member 148. An end portion of the feeding-rod 146 is connected to the upper portion of the feeding member 126 at the center thereof. The other end portion of the feeding rod 146 projects to the outside of the processing container 102 to be connected to a second high-frequency power supply 154 via a second matching unit 152.

Thus, when a predetermined high-frequency power for producing plasma, e.g., a high-frequency power of 0.5 to 4 kW, is applied at 13.56 to 100 MHz, preferably 27.12 MHz, from the second high-frequency power supply 154 to the upper electrode 124 via the second matching unit 152, the feeding rod and the feeding member 126, a predetermined electric field is produced in the processing chamber 104. Then, during an etching process, a processing gas introduced into the processing chamber 104 dissociates by the electric field to generate plasma.

In this preferred embodiment, a sensor 150 is connected to the feeding rod 146. The sensor 150 is provided for measuring Vdc generated by a predetermined high-frequency power for producing plasma. The output of the sensor 150 is connected to the second high-frequency power supply 154. Thus, during the etching process, the Vdc of the high-frequency power applied to the upper electrode 124 is measured by the sensor 150. On the basis of the Vcd, the second high-frequency power supply 154 is controlled to suitably adjust the output of the high-frequency power.

The reason why the output of the high-frequency power applied to the upper electrode 124 is controlled will be described. During the etching process, although the upper electrode 124 is damaged by ions in plasma, the degree of the damage is influenced by the magnitude of the Vdc. In addition, although deposits, such as reaction products, produced during the etching process are adhered to the upper electrode 124, the aforementioned ions also serve to remove the deposits by sputtering the upper electrode 124.

Thus, it is desired to sputter and remove the deposits adhered to the upper electrode 124 by the ions in plasma while controlling so as not to damage the upper electrode 124. Therefore, in this preferred embodiment, when a silicon oxide film of the wafer W is etched, the Vdc of the upper electrode 124 is controlled so as to be in the range of from −80 to −200 V. Furthermore, if the Vdc is set to be higher than the aforementioned range, e.g., −30 V, the upper electrode is not sputtered, so that the adhesion of the deposits proceeds. On the other hand, if the Vdc is set to be lower than the aforementioned range, the upper electrode 124 is significantly damaged.

The shape of the feeding member 126 in the preferred embodiment will be described in detail below.

Between the upper end portion of the feeding member 126, which has a substantially circular cross-section having a first diameter, and the connector portion 126b for applying a predetermined high-frequency power to the upper electrode 124, which has a substantially circular cross-section having a second diameter, the profile of a substantially vertical cross-section of the feeding member 126 is expressed by an exponential function r=f(L) in a rectangular coordinate system wherein it is assumed that the central axis of the upper electrode 124 is L-axis and the radial axis of the upper surface of the upper electrode 124 is r-axis.

Figure 2:
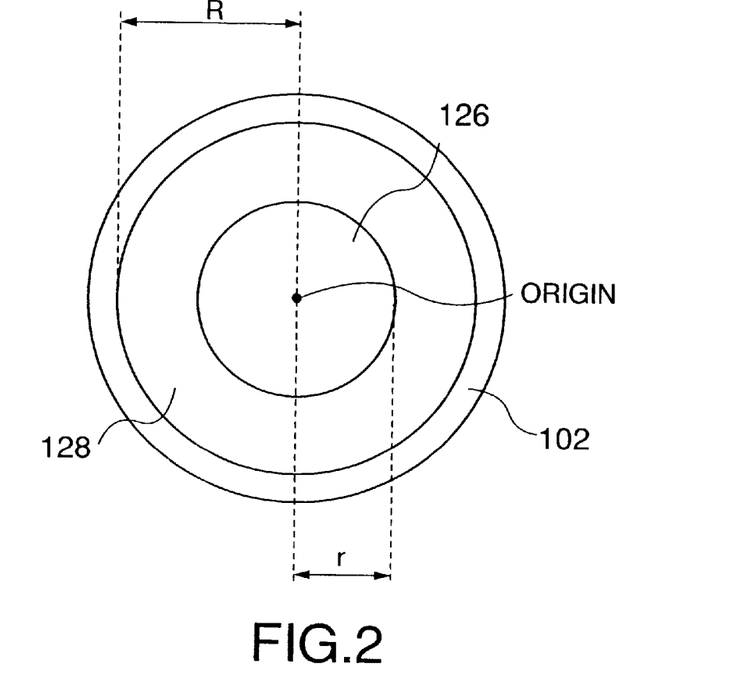
FIG. 2 is an explanatory drawing schematically illustrating the arrangement relationship between a feeding member and an upper electrode supporting member in the etching system of FIG. 1.

As mentioned above, the periphery of the feeding member 126 is covered with the upper electrode supporting member 128 of an insulating material so as to be supported thereon. It can be considered that the grounded processing container 102, the feeding member 126 and the upper electrode supporting member 128 are coaxial with each other. Therefore, assuming that these elements are coaxial with each other, impedance ($Z_0$) per unit length of the feeding member 126 can be expressed by the following formula (3);

$$Z_0 = \frac{138}{\sqrt{\varepsilon_r}} \log \frac{R}{r} \quad (3)$$

wherein $\varepsilon_r$ is a relative dielectric constant of the upper electrode supporting member 128, R is a distance between the center of the feeding member 126 and the outer periphery of the upper electrode supporting member 128 and r is a distance between the center of the feeding member 126 and the inner periphery thereof as shown in FIG. 2.

Figure 3:
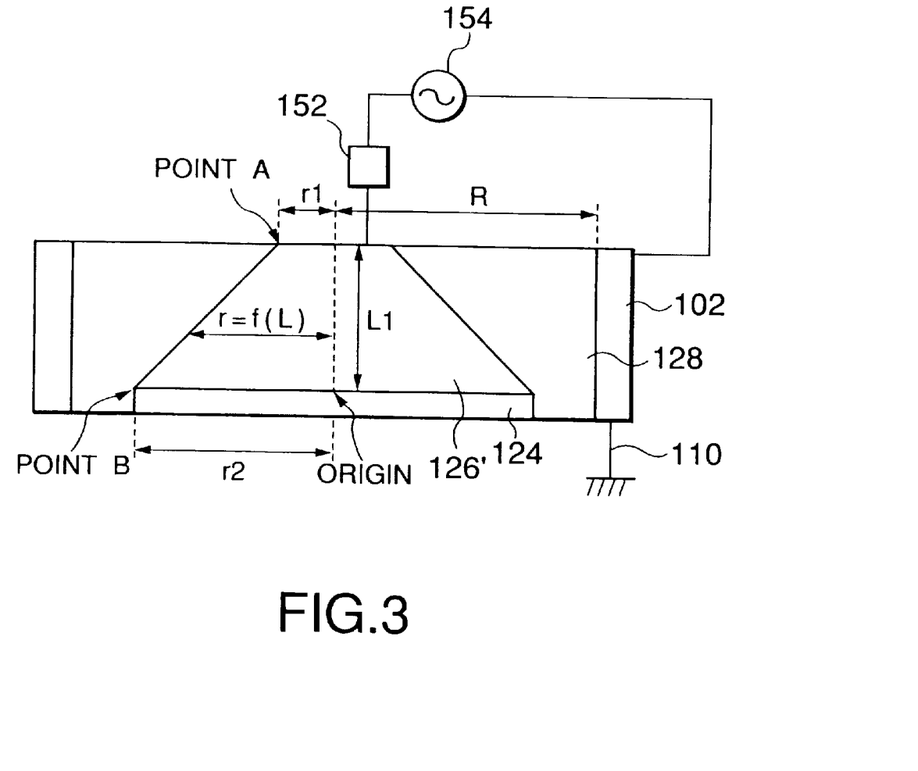
FIG. 3 is an explanatory drawing schematically illustrating the shape of a feeding member in the etching system of FIG. 1.

As shown in FIG. 3, assuming that point A is defined on the outer periphery of the upper end portion of a feeding member 126' and point B is defined on outer periphery of the upper end portion of an upper electrode 124 so that the points A and B are arranged on the same vertical cross-section, impedances ($Z_A$) and ($Z_B$) per unit length at the points A and B can be expressed by the following formulae (4) and (5).

$$Z_A = \frac{138}{\sqrt{\varepsilon_r}} \log \frac{R}{r_1} \quad (4)$$

$$Z_B = \frac{138}{\sqrt{\varepsilon_r}} \log \frac{R}{r_2} \quad (5)$$

Therefore, an average impedance ($Z_{ave}$) per unit length, which is an average of impedances between the points A and B, can be derived from the formulae (4) and (5) as expressed by formula (6):

$$Z_{ave} = \frac{(138/\sqrt{\varepsilon_r}) \cdot (\log(R/r1)) - \log(R/r2))}{L1} \quad (6)$$

wherein $r_1$ is a radius of the upper end portion of the feeding member 126', $r_2$ is a radius of the lower end portion of the feeding member 126', and L1 is a vertical distance between the upper and lower end portions of the feeding member 126'.

A variation in impedance per unit length ($\Delta Z$) between the points A and B can be expressed by a function of the radius (r) of the feeding member 126'. The radius (r) can be expressed by the following formula (7) as a function of the vertical distance (L) of the upper electrode 124.

$$r = f(L) \quad (7)$$

Therefore, $\Delta Z$ can be expressed by the following formula (8).

$$\Delta Z = \frac{dZ}{dr} = \left(\frac{138}{\sqrt{\varepsilon_r}}\right) \cdot \frac{d\left(\log \frac{R}{r}\right)}{dr} \quad (8)$$

From the formula (7) and the following formula (9), the formula (8) can be expressed by the following formula (10).

$$\frac{dr}{dL} = f'(L) \quad (9)$$

$$\Delta Z = \frac{dZ}{dL} = \left(\frac{138}{\sqrt{\varepsilon_r}}\right) \cdot \frac{d\left(\log \frac{R}{f(L)}\right)}{dL} \quad (10)$$

Figure 4:
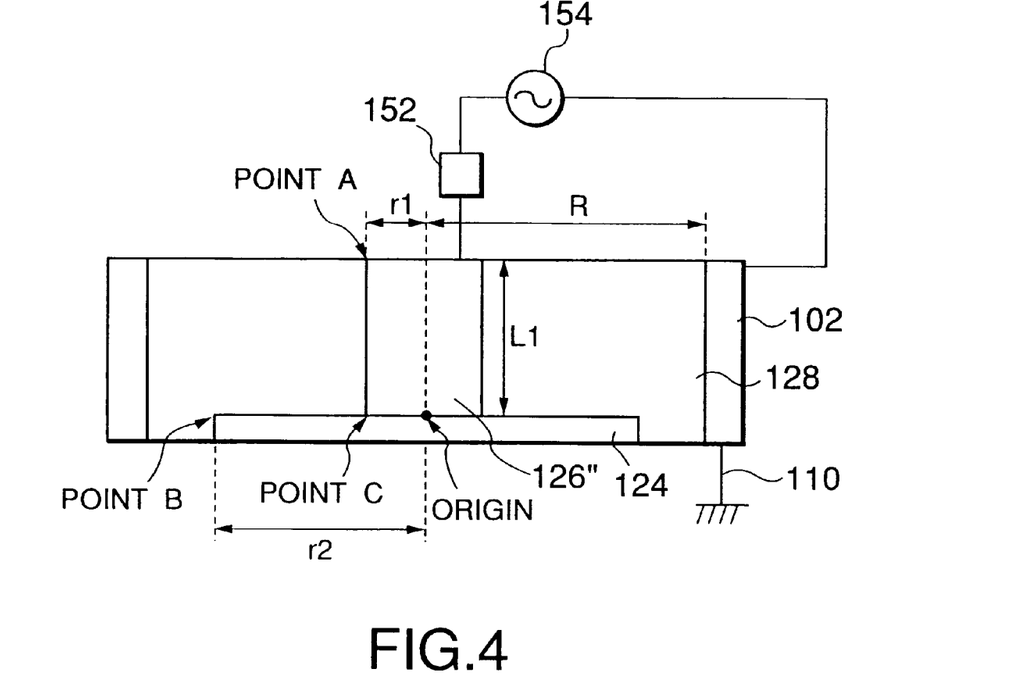
FIG. 4 is an explanatory drawing schematically illustrating the shape of a feeding member in the etching system of FIG. 1.

However, as a conventional feeding member 126" shown in FIG. 4, when the outer diameter of the feeding member 126" is extremely different from the outer diameter of the upper electrode 124, the following formula (11) must be satisfied in order to cause the maximum value of the variation in impedance to be minimum.

$$Z_{ave} = \Delta Z \quad (11)$$

Because the influence of skin effect must be considered particularly in a very high frequency (VHF) domain when a high-frequency power is used.

In addition, when the variation of the outer-diameter distance between the feeding member 126" and the upper electrode 124, i.e., the variation ($\Delta Z$) in impedance, is great, focusing of electric field may occur. In particular, as the frequency of the applied high-frequency power increases, the focusing of electric field becomes more conspicuous. Thus, in the structure shown in FIG. 4, which comprises the conventional feeding member 126' and the upper electrode 124, focusing of electric field may occur between points C and B defined on the lower end portion of the feeding member 126".

Therefore, in order to cause the maximum value of the variation ($\Delta Z$) in impedance to be minimum, the aforementioned formula (11) must be satisfied, so that the following formula (12) can be derived.

$$\frac{(138/\sqrt{\varepsilon_r}) \cdot (\log(R/r1)) - \log(R/r2))}{L1} = \left(\frac{138}{\sqrt{\varepsilon_r}}\right) \cdot \frac{d\left(\log \frac{R}{f(L)}\right)}{dL} \quad (12)$$

Then, the formula (12) will be solved about f(L). First, the formula (12) is rewritten as the following formula (13):

$$\alpha \cdot L = \beta \cdot \log\left(\frac{R}{f(L)}\right) \quad (13)$$

wherein f, $\alpha$ and $\beta$ are defined as follows:

$$\int \frac{(138/\sqrt{\varepsilon_r}) \cdot (\log(R/r1)) - \log(R/r2))}{L1} dL = \quad (14\text{-}1)$$

$$\left(\frac{138}{\sqrt{\varepsilon_r}}\right) \cdot \int d\left(\log \frac{R}{f(L)}\right)$$

$$\alpha = \frac{(138/\sqrt{\varepsilon_r}) \cdot (\log(R/r1)) - \log(R/r2))}{L1} \quad (14\text{-}2)$$

$$\beta = \left(\frac{138}{\sqrt{\varepsilon_r}}\right) \quad (14\text{-}3)$$

When the formula (12) is solved about f(L), the following formula (15) can be obtained.

$$r = f(L) = R \cdot \exp(-\alpha \cdot L/\beta) \qquad (15)$$

Figure 5:
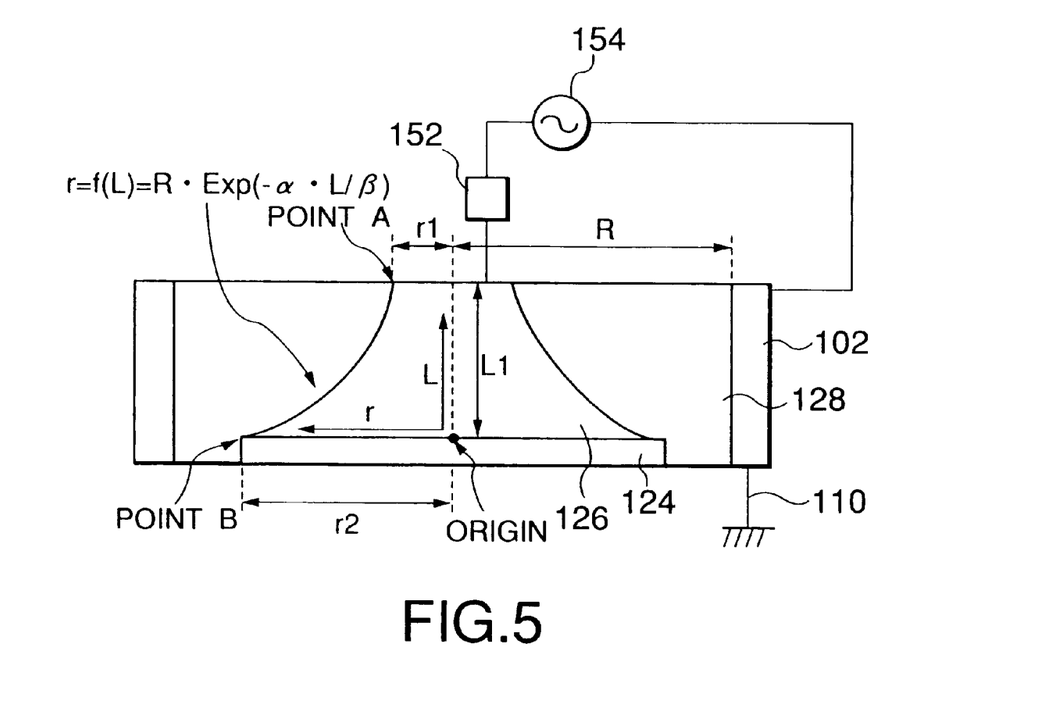
FIG. 5 is an explanatory drawing schematically illustrating the shape of a feeding member in the etching system of FIG. 1.

Therefore, the shape of the outer periphery of the feeding member 126 can be derived by an exponential function, i.e., the formula (15). Furthermore, as shown in FIG. 5, the shape of the outer periphery of the feeding member 126 may be optionally set in accordance with the values R, r, r1, r2, L and L1, i.e., the constructions of the system in this preferred embodiment.

As described above, if the shape of the feeding member 126 in this preferred embodiment is applied to the etching system 100, it is possible to prevent impedance from abruptly changing between the feeding member 126 and the upper electrode 124 to maintain a constant variation in impedance. Therefore, it is possible to prevent the dielectric breakdown and the damping of the high-frequency power, and to prevent the damage and heat generation of the upper electrode supporting member 128 covering the feeding member 126 and the upper electrode 124. Consequently, it is possible to uniformly achieve the plasma processing of the wafer W to improve the throughput. Furthermore, the sensor 150 is not shown in FIGS. 3 thorough 5.

Referring to FIG. 1 again, the construction of the inductively connected antenna in this preferred embodiment will be described in detail below. A substantially annular overhanging portion 102a is formed on the side wall of the processing container 102 substantially at the center thereof. The overhanging portion 102 is formed with a substantially annular opening 102b on the side of the plasma producing space formed between the upper electrode 124 and the susceptor 106.

A substantially tubular high-frequency antenna 156 of a conductive material, e.g., copper with silver plate, is provided, in the opening 102b so as to be substantially annularly wound by a number of windings which is as small as possible, e.g., 1 in this preferred embodiment, in order to obtain a high-density plasma without particularly increasing the distance between the upper electrode 124 and the lower electrode, i.e., the susceptor 106. The high-frequency antenna 156 is arranged so as to surround the plasma producing space formed in the processing chamber 104.

Between the high-frequency antenna 156 and the inner wall surface of the opening 102b, a dielectric member 158 of a dielectric material, e.g., quartz, is provided. The high-frequency antenna 156 is arranged on a second dielectric member 158b, and covered with a first dielectric member 158a via a space 157 exposed to atmosphere. Thus, the portions of the high-antenna 156 on the sides other than the side of the plasma producing space formed in the processing chamber 104 are electrically shielded by the processing container 102 grounded by the grounding conductor 109. Furthermore, an O-ring 159 is provided on the inner wall surface of the opening 102b near the open end thereof. Thus, when the dielectric member 158 is mounted, the processing chamber 104 is airtightly separated from the space 157 so as to maintain atmosphere in the space 157.

A portion of the side wall portion of the processing chamber 104 exposed to plasma i.e., a portion of the side wall portion of the processing chamber 104 extending from the overhanging portion 102a to the outer periphery of the upper electrode 124, is covered with a first shielding member 160 of a dielectric material, e.g., quartz. The first shielding member 160 has a substantially L-shaped vertical cross-section, and extends substantially annularly so as to tightly contact the aforementioned portion.

Thus, the first shielding member 160 protects the overhanging portion 102a, the upper electrode supporting member 128 and the upper electrode 124 from the adhesion of reaction products produced during the etching process and from the influence of the sputtering due to ions in plasma. If the reaction products are adhered and the etching are carried out, only the first shielding member 160 need be exchanged.

A substantially disk-shaped, second shielding member 162 of an insulating material, e.g., a ceramic, is provided so as to tightly contact the bottom surface of the overhanging portion 102a of the processing container 102 to prevent plasma from being introduced. If reaction products are adhered, only the second shielding member 162 need be exchanged.

The feeding of a predetermined high-frequency power to the high-frequency antenna and the grounding construction thereof will be described below.

Figure 6A:
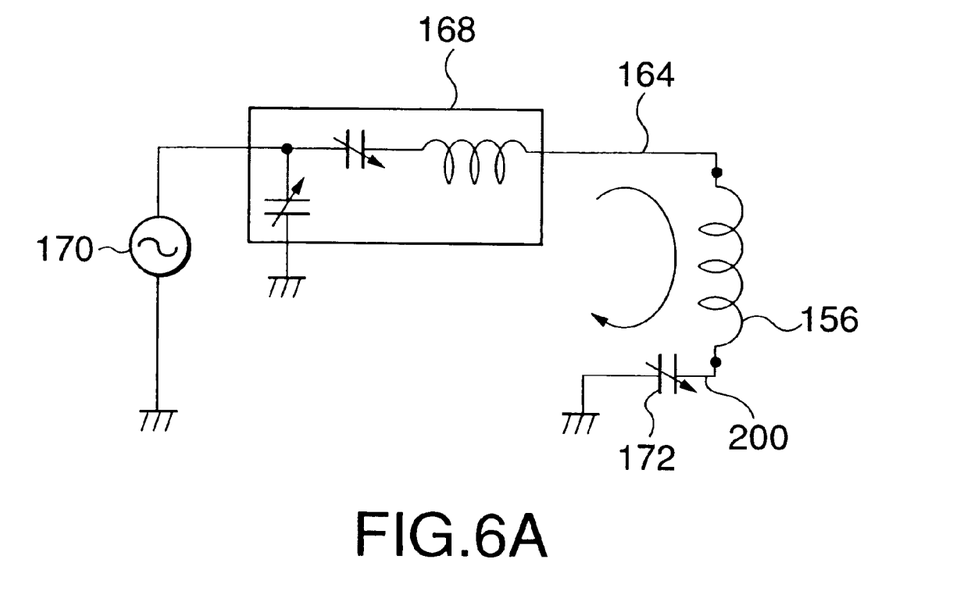
FIGS. 6A and 6B are explanatory drawings schematically illustrating an equivalent circuit of an antenna circuit for a high-frequency antenna and the shape of the antenna in the etching system of FIG. 1.
Figure 6B:
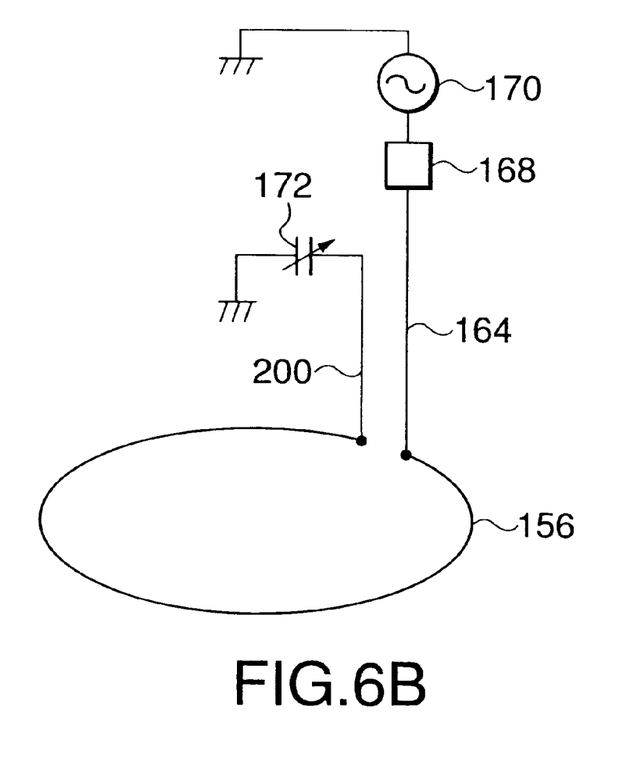

As shown in FIGS. 6A and 6B, one end of the high-frequency antenna 156 is connected to a feeding line 164, and the other end thereof is connected to a grounding line 200. The feeding line 164 and the grounding line 200 are made of the same material as that of the high-frequency antenna 156, and have the same vertically cross-sectional shape as that of the high-frequency antenna 156.

First, the feeding line 164 connected to the high-frequency antenna 156 will be described. The feeding line 164 passes through a through opening 102c formed in the overhanging portion 102a, and passes through the upper electrode supporting member 128 and a substantially annular insulating ring 167 formed in the upper wall of the processing container 102, to extend to the outside. Between the feeding line 164 and the inner wall of the through opening 102c, a space for preventing electric conducting is formed.

Below the through opening 102c, a substantially annular feeding-line supporting member 166 of an insulating material, e.g., a ceramic, is provided for supporting thereon the feeding line 164. The upper surface of the feeding-line supporting member 166 has irregularities in order to ensure creeping distance to prevent the electric field of a high-frequency power from damping.

The grounding line 200 connected to the high-frequency antenna 156 has substantially the same construction as that of the feeding line 164. That is, the grounding line 200 extends from the high-frequency antenna 156 to pass through a first dielectric member 158a and a grounding-line supporting member (not shown) having substantially the same construction as the feeding-line supporting member 166, and passes through a through opening (not shown) formed in the overhanging portion 102a to pass through the upper electrode supporting member 128 and the upper wall of the processing container 102 to extend to the outside.

Since a refrigerant, e.g., water or glycol, circulates through the high-frequency antenna 156, the feeding line 164 and the grounding line 200, it is possible to absorb the heat produced during the etching process to prevent the heating of the surrounding portion of the high-frequency antenna 156.

The feeding line 164 is connected to a third high-frequency power supply 170 via a third matching unit 168. Thus, a predetermined high-frequency power, e.g., a high-frequency power of 1 to 4 kW, is applied at, e.g., 13.56 to 27.12 MHz, preferably 13.56 MHz, from the third high-frequency power supply 170 to the high-frequency antenna 156 via the third matching unit 168 and the feeding line 164.

The grounding line 200 shown in FIGS. 6A and 6B is connected to a variable capacitor 172, which can be optionally set in the range of from 100 pF to 1000 pF. Thus, between the high-frequency antenna 156 and the processing chamber 104, an antenna circuit expressed by the equivalent circuit shown in FIGS. 6A and 6B is formed. In this preferred embodiment, it is possible to cause a series resonance state at the mid point of the high-frequency antenna 156 being regarded as a coil by suitably adjusting the capacitance of the variable capacitor 172.

Assuming that L is an inductance of a high-frequency antenna, C is a capacitance of the condenser and ω is an angular frequency of a predetermined high-frequency power applied from the third high-frequency power supply 170 to the high-frequency antenna 156, if the capacitance (C) of the capacitor is adjusted so as to satisfy the following formula 16, the series resonance state occurs at the mid point of the high-frequency antenna 156.

$$\frac{L\omega}{2} = \frac{1}{C\omega} \qquad (16)$$

Figure 7:
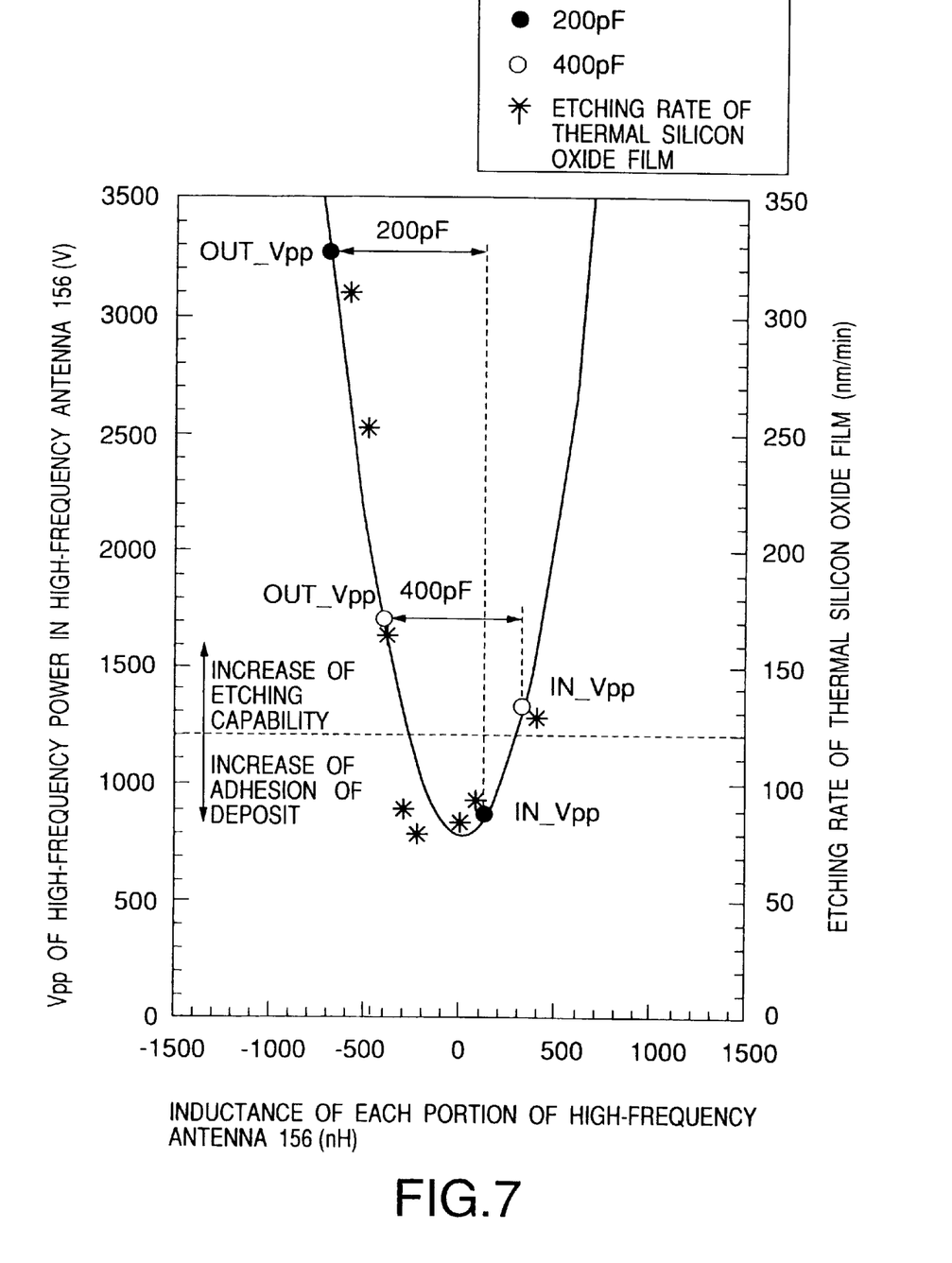
FIG. 7 is a graph for schematically explaining a series resonance state at the midpoint of an antenna circuit for a high-frequency antenna in the etching system of FIG. 1.

Referring to FIG. 7, the relationship between the capacitance (C) of the capacitor and the series resonance state at the mid point of the antenna circuit of the high-frequency antenna 156 will be described. Furthermore, the interior of the processing chamber 104 is maintained at a reduced pressure of 40 mTorr using $C_4F_8/Ar/O_2$ (the flow rates thereof are 20/560/8 sccm, respectively) as a processing gas for a silicon oxide film on a silicon wafer W having a diameter of 12 inches, and then, the measured results were obtained by the etching process while applying a high-frequency power of 1000 W at 27.12 MHz to the upper electrode 124 and a high-frequency power of 1500 W at 800 kHz to the susceptor 106, and a high-frequency power of 1500 W at 13.56 MHz to the high-frequency antenna 156. The capacitance of the variable capacitor 172 connected to the high-frequency antenna 156 via the grounding line 200 was set to be 200 pF and 400 pF.

In FIG. 7, the axis of abscissas indicates the inductance of each portion of the high-frequency antenna 156 on the basis of ground, and the unit thereof is nH. However, in fact, the axis of abscissas indicates values calculated by the following formula 17, not inductance, and the unit is not nH.

$$\left(L\omega - \frac{1}{C\omega}\right)\frac{1}{\omega} \qquad (17)$$

The left axis of ordinates indicates voltages between the peaks of a predetermined high-frequency power applied to the high-frequency antenna 156, which will be hereinafter referred to as "Vpp", and the unit thereof is V. The right axis of ordinates indicates etching rates of a thermal silicon oxide ($SiO_2$) film, for experiments, adhered to the surface of the first shielding member 160 on the side of the processing chamber at a location facing the high-frequency antenna 156 substantially in parallel thereto, and the unit thereof is nm/mm.

First, the relationship between the Vpp of the high-frequency power of each portion of the high-frequency antenna 158 and the inductance of the high-frequency antenna 156 can be expressed by a parabola, which is convex downwards as shown in FIG. 7. This can be plotted on the same parabola even if the capacitance of the variable capacitor 172 is set to be 200 pF or 400 pF.

In FIG 7, IN__Vpp denotes the Vpp of a high-frequency power at the connecting portion of the high-frequency antenna 156 with the feeding line 164, and OUT__Vpp denotes the Vpp of a high-frequency power at the connecting portion of the high-frequency antenna 156 with the grounding line 200. When the capacitance of the variable capacitor 172 is 200 pF, the IN__Vpp at the connecting portion of the high-frequency antenna 156 with the feeding line 164 is 800 V, and the inductance thereof is 100 nH. In addition, the OUT__Vpp at the connecting portion of the high-frequency antenna 156 with the grounding line 200 is 3300 V, and the inductance thereof is −700 nH. On the other hand, when the capacitance of the variable condenser 172 is 400 pF, the IN__Vpp at the connecting portion of the high-frequency antenna 156 with the feeding line 164 is 1300 V, and the inductance thereof is 300 nH. In addition, the OUT__Vpp at the connecting portion of the high-frequency antenna 156 with the grounding line 200 is 1700 V, and the inductance thereof is −400 nH.

When the capacitance of the variable capacitor 172 is set so that series resonance occurs at the mid point of the high-frequency antenna 156, the IN__Vpp is equal to the OUT__Vpp, so that the lowest point of the parabola shown in FIG. 7 is the mid point of the high-frequency antenna 156. Therefore, during the series resonance state, the variation in the Vpp of the high-frequency power in the respective points of the high-frequency antenna 156 decreases to be equalized. Even if the Vpp is equalized, the degree of the adhesion of the reaction product may be great and the degree of the sputtering thereof may be great. However, it is possible to control the degree of the adhesion and sputtering of the reaction product by increasing and decreasing the magnitude of the high frequency power applied to the high-frequency antenna 156.

While the capacitance of the variable capacitor 172 has been fixed to be 200 pF or 400 pF for measurement, the present invention should not be limited thereto, but the capacitance of the variable capacitor 172 nay be adjusted so that series resonance occurs at the mid point of the high-frequency antenna 156, i.e., so that the IN__Vpp is equal to the OUT__Vpp. In addition, while variable capacitor 172 has been adjusted so that series resonance occurs at the mid point of the high-frequency antenna 156 when adjusting the etching system 100, it is not necessary to change the value of the variable condenser 172.

When the Vpp of the high-frequency power to the high-frequency antenna 156 is about 1200 V or more, the etching rate for the thermal silicon oxide film increases in proportion to the increase of the Vpp. When the Vpp is about 1200 V or less, the etching rate is in the range of from about 30 to about 100 nm/min.

Since the high-frequency antenna 156 is covered with the first shielding member 160 on the side of the processing chamber during a usual etching process, the first shielding member 160 is sputtered in place of the thermal silicon oxide film. Simultaneously, deposits of reaction products are produced to be adhered to the first shielding member 160 on the side of the processing chamber 104. Consequently, the dispersion in the Q-value between the high-frequency antenna 156 and the plasma producing space may occur, and the uniformity of plasma produced by the high-frequency power applied to the high-frequency antenna may be lowered.

Therefore, it is desired to provide the etching capability for the sputtering and removing of the deposits adhered to the first shielding member 160. In this case, the etching rate is, e.g., 120 nm/mm under the aforementioned conditions. Therefore, the capacitance of the variable capacitor 172 connected to the high-frequency antenna 156 via the grounding line 200 is adjusted so that a relatively uniform sputtering is carried out over the whole periphery of the high-frequency antenna 156, i.e., the whole periphery of the first shielding member 160 facing the high-frequency antenna 156 on the side of the processing chamber 104, at the desired etching rate, in order to cause series resonance at the mid point of the high-frequency antenna 156.

For example, when the capacitance of the variable capacitor 172 is set to be 200 pF, the etching rate at the connecting portion of the high-frequency antenna 156 with the feeding line 164 is about 90 nm/min. Thereafter, although the etching rate decreases to about 80 nm/mm once, it increases again to exceed the desired etching rate (120 nm/mm) at a relatively short distance. Moreover, the etching rate increases rapidly as the grounding line 200 approaches the connecting portion, so that the etching rate at the connection portion of the grounding line 200 reaches to about 310 nm/mm. Consequently, most of the first shielding member 160 facing the high-frequency antenna 156 on the side of the processing chamber 104, particularly on the grounded side of the high-frequency antenna 156, may be excessively etched.

For example, when the capacitance of the variable capacitor is set to be 400 pF, the etching rate of the thermal silicon oxide film at the connecting portion of the high-frequency antenna 156 with the feeding line 164 is about 130 nm/min. Therefore, as approaching the connecting portion of the high-frequency antenna 156 with the grounding line 200, the etching rate decreases to about 80 nm/mm once, and then, the etching rate increases. The etching rate at the connecting portion of the high-frequency antenna with the grounding line 200 is about 160 nm/min.

Thus, in comparison with when the capacitance of the variable capacitor 172 connected to the high-frequency antenna 156 via the grounding line 200 is set to be 200 pF, when the capacitance is set to be, e.g., 400 pF, the whole periphery of the high-frequency antenna 156, i.e., the whole periphery of the first shielding member 160 facing the high-frequency antenna 156 on the side of the processing chamber 104, is etched at an etching rate relatively near the desired etching rate (120 nm/nm). Therefore, it is possible to effectively remove the deposits adhered to the first shielding member 166.

In this preferred embodiment, it is desired to set the capacitance of the variable capacitor 172 connected to the high-frequency antenna 156 via the grounding line 200 so that the Vpp of the high-frequency power to the high-frequency antenna 156 is minimum at the mid point of the antenna circuit of the high-frequency antenna 156, i.e., so that series resonance occurs at the mid point.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

For example, while the high-frequency antenna 156 has been wound annularly only once in the above described preferred embodiment, it may be wound twice if a high-density plasma can be obtained particularly without increasing the distance between the upper electrode 124 and the lower electrode, i.e., the susceptor 106.

Also, while the refrigerant has circulated in the high-frequency antenna 156 to adjust temperature in the above described preferred embodiment, the present invention should not be limited thereto, but the high-frequency antenna may have a substantially rod shape, so that no refrigerant may circulate.

In addition, while the substantially annular first shielding member 160 having the substantially reverse L-shaped vertical cross-section extending from the surface of the high-frequency antenna 156 on the side of the processing chamber 104 via the dielectric member 158 to the outer peripheral portion of the upper electrode 124 on the side of the processing chamber 104 has been provided in the above described preferred embodiment, the present invention should not be limited thereto, but the shielding member may comprise two parts or more.

Moreover, while the feeding member 126 has been provided between the feeding rod 146 and the upper electrode 124 in the above described preferred embodiment, the present invention should not be limited thereto, but the feeding rod and the feeding member may be integrally formed.

Further, while the etching system for etching the semiconductor wafer W has been described in the above described preferred embodiment, the present invention should not be limited thereto, but the object to be processed may be a glass substrate for LCD, and the present invention may be applied to a CVD system or the like.

As described above, according to the present invention, an antenna of, e.g., 1 turn, is provided around a plasma producing space in order to obtain a high-density plasma without particularly increasing the distance between an upper electrode and a lower electrode, so that it is possible to produce a high-density plasma without particularly expanding a processing space. Therefore, since the exhaust capacity does not decrease, it is possible to control the residence time to a desired state to improve etching characteristics.

In addition, since the antenna is grounded to be shielded on the sides other than the side of the plasma producing space, and since the antenna is arranged under atmospheric pressure, it is possible to produce uniform plasma only at the plasma producing space.

In addition, since the capacitance of the capacitor is adjusted so that series resonance occurs at the mid point of the antenna, a desired electric field can be formed over the whole periphery of the antenna.

Moreover, since the output of the high-frequency power applied to the upper electrode is controlled on the basis of the Vdc of the high-frequency power, it is possible to inhibit the upper electrode from being excessively sputtered. In addition, since the feeding line has a shape so that the maximum value of the variation in impedance per substantially vertical unit length is minimum, it is possible to prevent the electric breakdown and the damping of the high-frequency power.

What is claimed is:

1. The plasma processing system for plasma-processing an object to be processed, arranged in a plasma producing space, the plasma processing system comprising:

an upper electrode arranged in a sealed processing chamber;

a lower electrode, arranged so as to face the upper electrode, for mounting thereon the object to be processed;

high frequency power applying means for applying a predetermined high-frequency power between the upper and lower electrodes to form a plasma in said plasma producing space between the upper and lower electrodes;

an inductively coupled antenna wound by a predetermined number of turns capable of applying a predetermined high-frequency power so as to surround the periphery of said plasma producing space, said antenna being shielded by a grounded member on sides other than the side of said plasma producing space;

an insulating wall provided between said antenna and said plasma producing space; and an exchangeable insulating member between said upper electrode and said antenna, for covering a peripheral portion of said upper electrode on a side facing said plasma producing space, and for covering a portion of said antenna on a side facing said plasma producing space.

2. The plasma processing system according to claim 1, wherein said predetermined number of turns of said antenna is 1.

3. The plasma processing system according to claim 2, wherein a capacitor is provided in series with between said antenna and ground, and a capacitance of said capacitor is adjusted so that series resonance occurs at the mid point of said antenna.

4. The plasma processing system according to claim 1, wherein said antenna is provided in a wall portion of said processing chamber via said insulating wall, and said antenna is exposed to atmosphere.

5. The plasma processing system according to claim 1, further comprising:

a detector for detecting a self-bias voltage of the high-frequency power applied to said upper electrode; and control means for controlling the self-bias voltage detected by the detector so as to be maintained in a set range.

* * * * *